(12) United States Patent
Momota

(10) Patent No.: US 10,003,249 B2
(45) Date of Patent: Jun. 19, 2018

(54) INSULATED GATE SEMICONDUCTOR DEVICE INCLUDING SWITCHABLE INSULATED GATE SEMICONDUCTOR ELEMENT

(71) Applicant: FUJI ELECTRIC CO., LTD., Kawasaki-shi (JP)

(72) Inventor: Seiji Momota, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days. days.

(21) Appl. No.: 14/879,553

(22) Filed: Oct. 9, 2015

(65) Prior Publication Data

US 2016/0036316 A1 Feb. 4, 2016

Related U.S. Application Data

(63) Continuation of application No. PCT/JP2014/066907, filed on Jun. 25, 2014.

(30) Foreign Application Priority Data

Sep. 25, 2013 (JP) .................. 2013-198206

(51) Int. Cl.
 *H02M 1/08* (2006.01)
 *H02M 1/088* (2006.01)
 (Continued)

(52) U.S. Cl.
 CPC ............. *H02M 1/088* (2013.01); *H02M 1/08* (2013.01); *H02M 7/00* (2013.01); *H02M 7/21* (2013.01);
 (Continued)

(58) Field of Classification Search
 CPC ...................................................... H02M 1/08
 (Continued)

(56) References Cited

U.S. PATENT DOCUMENTS 6,400,177 B1 * 6/2002 Yoshizaki ........ H03K 19/00361
326/30
2005/0258814 A1 * 11/2005 Chen .................... H02M 3/1588
323/285
(Continued)

FOREIGN PATENT DOCUMENTS

| CN | 102549925 A | 7/2012 |
| JP | 2007-259576 A | 10/2007 |
| JP | 2010-088036 A | 4/2010 |

*Primary Examiner* — Kyle J Moody
*Assistant Examiner* — Trinh Q Dang
(74) *Attorney, Agent, or Firm* — Rabin & Berdo, P.C.

(57) ABSTRACT

An insulated gate semiconductor device includes an insulated gate semiconductor element, an output current detection unit, a voltage detection unit, and a heat generation amount suppression unit. The insulated gate semiconductor element on-operates by receiving a first gate voltage at a control terminal, and switches and outputs an input voltage to a load. The output current detection unit detects an output current to the load. The voltage detection unit detects an on-voltage of the insulated gate semiconductor element. The heat generation amount suppression unit sets a gate voltage to be applied to the control terminal of the insulated gate semiconductor element higher than the first gate voltage in response to the output current exceeding a rated current value and the on-voltage being lower than a first threshold voltage.

13 Claims, 4 Drawing Sheets

(51) Int. Cl.
*H02M 7/00* (2006.01)
*H02M 7/21* (2006.01)
*H03K 17/06* (2006.01)
*H03K 17/082* (2006.01)
*H02M 7/5387* (2007.01)
*H03K 17/08* (2006.01)

(52) U.S. Cl.
CPC ........ *H02M 7/53871* (2013.01); *H03K 17/06* (2013.01); *H03K 17/0828* (2013.01); *H02M 7/5387* (2013.01); *H03K 2017/0806* (2013.01)

(58) Field of Classification Search
USPC .......................................................... 363/78
See application file for complete search history.

(56) References Cited

U.S. PATENT DOCUMENTS

| | | | |
|---|---|---|---|
| 2007/0221994 A1 | 9/2007 | Ishikawa et al. | |
| 2011/0141784 A1* | 6/2011 | Lee ..................... | H02M 7/217 363/127 |
| 2011/0304941 A1* | 12/2011 | Tanimura ................. | H02J 3/14 361/93.9 |
| 2012/0153719 A1 | 6/2012 | Inaba et al. | |
| 2013/0021702 A1* | 1/2013 | Waltman ................. | H02H 3/24 361/91.1 |

* cited by examiner

INSULATED GATE SEMICONDUCTOR DEVICE INCLUDING SWITCHABLE INSULATED GATE SEMICONDUCTOR ELEMENT

CROSS-REFERENCE TO RELATED APPLICATION

This application is a Continuation of International Application PCT/JP2014/066907 filed on Jun. 25, 2014, and claims priority to, Japanese Patent Application No. 2013-198206, filed on Sep. 25, 2013, the contents of both of which are entirely incorporated herein by reference for all purposes.

BACKGROUND

1. Technical Field

The present disclosure relates to an insulated gate semiconductor device which supplies power to a load by switching an insulated gate semiconductor element, such as an IGBT or a power MOS-FET.

2. Description of Related Art

As a drive device which drives a load such as a motor, a semiconductor device which, by switching and driving a semiconductor element such as a transistor, converts input power to power suitable for driving the load, is known. FIG. 4 is a main portion outline configuration diagram showing one example of this kind of semiconductor device 1 which is introduced in detail in, for example, JP-A-2010-88036.

The semiconductor device 1 includes a diode bridge circuit DB, which rectifies input alternating current power AC, and a converter 2 which converts the output of the diode bridge circuit DB to direct current power of a predetermined voltage. The semiconductor device 1 further includes a chopper circuit 3 which boosts and supplies the direct current power, obtained from the converter 2, to a load RL such as a motor.

Incidentally, the converter 2 includes a switching element S1, formed of, for example, a MOS-FET, which switches the output of the diode bridge circuit DB, at a predetermined frequency, via the primary winding of an isolation transformer T. The converter 2 further includes a rectifying and smoothing circuit formed of a diode D1, which rectifies and outputs a voltage generated in the secondary winding of the isolation transformer T, and a capacitor C1 which smoothes the output of the diode D1. The converter 2 of a flyback type configured in this way, by controlling, for example, the on-width of the switching element S1 using a main control section 4, controls an output voltage generated in the secondary winding of the isolation transformer T.

Also, the chopper circuit 3 includes an inductor L, to which is applied the output voltage of the converter 2, and a switching element S2 which controls a current flowing through the inductor L. The switching element S2 on-operates when a predetermined gate voltage is applied from a drive section 5, and accumulates power energy in the inductor L. The power energy accumulated in the inductor L is emitted from the inductor L by an off-operation of the switching element S2. Further, the power energy emitted from the inductor L, after being accumulated in a capacitor C2 via a diode D2, is supplied to the load RL as a direct current voltage. Incidentally, the switching element S2 is formed of, for example, a junction FET, superior in high speed followability, which is used in a unipolar mode.

Herein, the semiconductor device 1 includes a current detection section 6 which detects an output current supplied to the load RL from the chopper circuit 3 or a current flowing through the switching element S2. The current detection section 6 assumes the role of detecting whether or not the current supplied to the load RL exceeds a preset threshold value, that is, an overcurrent. Also, the voltage control section 7, when an overcurrent is detected by the current detection section 6, drives the switching element S2 in a bipolar mode by setting a gate voltage output by the drive section 5 to be higher than a built-in voltage of the switching element S2. In this way, the on-resistance of the switching element S2 is kept low by causing the switching element S2 to operate in the bipolar mode when an overcurrent is detected. Further, an overheat destruction of the switching element S2 due to an overcurrent is prevented.

In FIG. 4, temperature monitoring section 8 detects an operating temperature of the switching element S2 from the current flowing through the gate of the switching element S2, which is detected via a resistor R. The respective on-widths of the switching elements S1 and S2 are feedback controlled in response to the operating temperature of the switching element S2 detected by the temperature monitoring section 8, and the output voltage for the load RL is stabilized.

SUMMARY

In the meantime, the semiconductor device 1 configured using the junction FET as the switching element S2 has a limitation in increasing the output power of the semiconductor device 1. Therefore, recently, there have been more cases in which an insulated gate semiconductor element, such as an IGBT or a MOS-FET, having a high short circuit capacity is used mainly as the switching element S2 or the like. However, a device using the insulated gate semiconductor element, unlike the device using the junction FET, cannot cause the insulated gate semiconductor element to operate by switching between the unipolar mode and the bipolar mode.

Meanwhile, when the load RL is an inductive load such as a motor, a large current flows temporarily to the motor, for example, when the motor starts. Therefore, when designing the semiconductor device 1 acting as a drive device of the motor, in general, it is necessary to employ an insulated gate semiconductor element having a high short circuit capacity anticipating a current flowing when the motor starts. However, an insulated gate semiconductor element having a high short circuit capacity is large and expensive. Therefore, it is desirable to realize the drive device, which drives the motor, by employing an insulated gate semiconductor element commensurate with the rated power capacity of the motor.

The disclosure, having been contrived bearing in mind these kinds of circumstances, provides an insulated gate semiconductor device of a simple configuration wherein it is possible, even when supplying power to an inductive load such as a motor by switching input power, to prevent an overheat destruction of an insulated gate semiconductor element due to a temporary overcurrent generated in the load.

In order to achieve the described, an insulated gate semiconductor device includes an insulated gate semiconductor element formed of an IGBT or power MOS-FET which on-operates by having a control terminal receive a first gate voltage set in response to output specifications, and switches and outputs an input voltage to a load; output current detection means which detects an output current which is output to the load with the switching operation of the insulated gate semiconductor element; and voltage detection means which detects an on-voltage of the insulated gate semiconductor element as a collector-emitter voltage Vice of the IGBT or a drain-source voltage Vds of the power MOS-FET.

In particular, the insulated gate semiconductor device includes a heat generation amount suppression means which, when the output current exceeds a rated current value and the on-voltage is lower than a preset first threshold voltage, suppresses the heat generation amount of the insulated gate semiconductor element by setting a gate voltage to be applied to the control terminal of the insulated gate semiconductor element to be higher than the first gate voltage.

That is, by focusing attention on the on-voltage of the insulated gate semiconductor element when an overcurrent is detected, it is determined, when the on-voltage is lower than the first threshold voltage, that the overcurrent is a temporary overcurrent, for example, when the motor starts. Further, the gate voltage to be applied to the control terminal of the insulated gate semiconductor element is set to be higher than the first gate voltage to be applied to the control terminal of the insulated gate semiconductor element when in a normal operation in which the overcurrent is not generated. As a result, the on-resistance of the insulated gate semiconductor element is set to be lower than when in the normal operation, and an overheat destruction of the insulated gate semiconductor element is prevented. Incidentally, the first threshold voltage is set as being, for example, substantially twice the on-voltage of the insulated gate semiconductor element when the output current is a rated current.

Also, the insulated gate semiconductor device further includes an output current reduction means which, when the output current exceeds the rated current value and the on-voltage is higher than a second threshold voltage set in response to a maximum rated voltage of the insulated gate semiconductor element, reduces the output current by setting the gate voltage to be applied to the control terminal to be lower than the first gate voltage.

That is, when the on-voltage of the insulated gate semiconductor element when an overcurrent is detected is higher than the second threshold voltage, it is determined to be a generation of an overcurrent resulting from a short circuit of the load. Further, in this case, the insulated gate semiconductor element is protected against an overcurrent by constricting or interrupting the output current by setting the gate voltage to be applied to the control terminal of the insulated gate semiconductor element to be low. Incidentally, the second threshold voltage is set as being, for example, substantially ½ of the maximum rated voltage of the insulated gate semiconductor element.

In the insulated gate semiconductor device of the described configuration, by focusing attention on the on-voltage of the insulated gate semiconductor element, it is determined whether an increase in the output current is a temporary one responding to the condition of the load or results from a short circuit of the load. Further, when the on-voltage is lower than the first threshold voltage and the increase in the output current is a temporary one, the gate voltage to be applied to the control terminal of the insulated gate semiconductor element is raised, while the on-resistance of the insulated gate semiconductor element is lowered. As a result, it is possible to prevent a heat generation of the insulated gate semiconductor element resulting from the increase in the output current, and prevent an overheat destruction of the insulated gate semiconductor element.

Consequently, there is no need to construct an insulated gate semiconductor device using, for example, an insulated gate semiconductor element having an excessive current capacity compared with the rated current in anticipation of even a temporary increase in output current responding to the condition of the load. Moreover, as a temporary increase in the output current is detected from the on-voltage of the insulated gate semiconductor element, the detection itself is simple and high in reliability. Therefore, it is possible to realize an insulated gate semiconductor device, which operates so as to be stable against a temporary fluctuation of the load, using a small and inexpensive insulated gate semiconductor element responding to the output specifications.

Also, when the load is short-circuited, the short circuit of the load is detected from an abnormal rise in the on-voltage of the insulated gate semiconductor element. Further, in this case, as the output current is suppressed or interrupted by lowering the gate voltage to be applied to the control terminal of the insulated gate semiconductor element, it is possible to effectively protect the insulated gate semiconductor element against an overcurrent resulting from a short circuit failure of the load.

DETAILED DESCRIPTION

Figure 1:
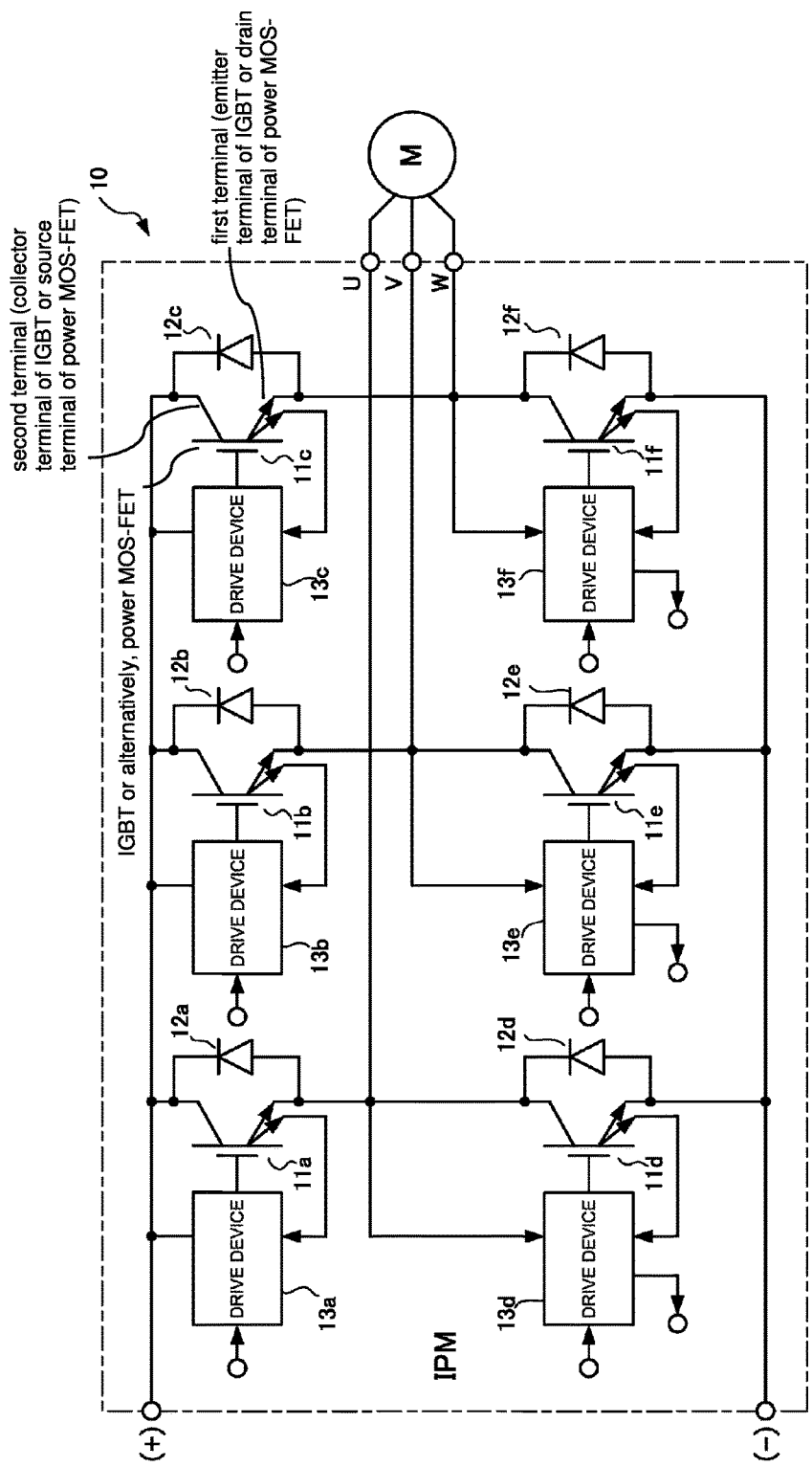
FIG. 1 is a main portion outline configuration diagram of an insulated gate semiconductor device according to one embodiment of the invention.

Hereafter, a description will be given, referring to the drawings, of an insulated gate semiconductor device according to one embodiment.

The insulated gate semiconductor device is realized as, for example, an inverter device 10 which supplies a drive current to a three-phase alternating current motor M, as shown in FIG. 1. The inverter device 10 includes a power semiconductor module packaged including six IGBTs 11a to 11f as insulated gate semiconductor elements large in power capacity. The six IGBTs 11a to 11f configure the main part of the inverter device 10 which drives the three-phase alternating current motor M acting as a load. The inverter device 10 supplies a drive current to the three-phase alternating current motor M by driving the plurality of IGBTs 11a to 11f on and off, with the IGBTs 11a to 11f correlated with each other, using an unshown control circuit.

Incidentally, the six IGBTs 11a and 11b to 11f are connected in pairs in series to form three half-bridge circuits HB. Also, six free wheeling diodes 12a to 12f are connected in reverse parallel to the IGBTs 11a to 11f respectively. The three half-bridge circuits HB are connected in parallel to form a three-phase full-bridge circuit which drives the three-phase alternating current motor M. 13a to 13f in the drawing are drive devices which drive the respective IGBTs 11a to 11f on and off.

The three half-bridge circuits HB, by being driven correlated with each other, supply three phase currents of a U phase, a V phase, and a W phase, 120° different in phase from one another, to the three-phase alternating current motor M from the series connection point of the IGBTs 11a and 11d, the series connection point of the IGBTs 11b and 11e, and the series connection point of the IGBTs 11c and 11f, each pair of IGBTs configuring each respective half-bridge circuit HB.

Specifically, each upper arm IGBT 11a, 11b, and 11c and each respective lower arm IGBT 11d, 11e, and 11f in each half-bridge circuit HB are driven on and off by receiving a pulse-width modulated gate drive signal of a constant cycle from each respective drive device 13a to 13f. As a result of this, a current responding to the pulse width of the gate drive signal is supplied to the three-phase alternating current motor M, via the upper arm IGBT 11a (11b, 11c), through a positive half-cycle. Also, a current responding to the pulse width of the control signal is supplied to the three-phase alternating current motor M, via the lower arm IGBT 11d (11e, 11f), through a negative half-cycle.

That is, the half-bridge circuits HB supply alternating currents, which are 120° different in phase from one another, to the three-phase alternating current motor M. A current supplied to the three-phase alternating current motor M is formed of a pulse current synchronous with the control signal, and the pulse current forms a discrete sine-wave current waveform.

Figure 2:
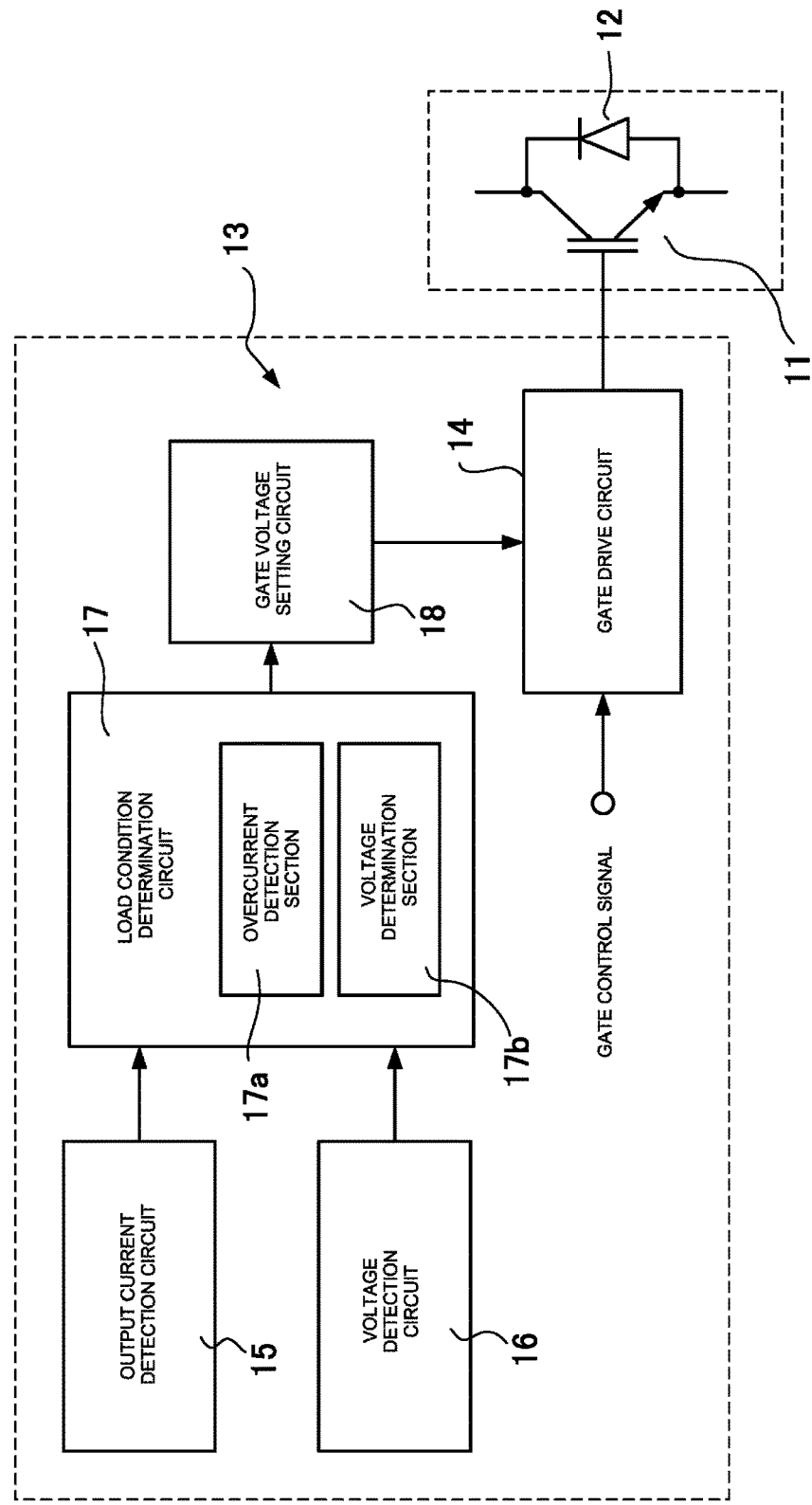
FIG. 2 is an outline configuration diagram of a drive device of an insulated gate semiconductor element of the insulated gate semiconductor device shown in FIG. 1.

Now, each drive device 13 (13a to 13f), which drives each respective IGBT 11 (11a to 11f) on and off, includes a gate drive circuit 14 which generates a gate drive signal of a predetermined voltage by receiving a gate control signal, as the main portion outline configuration of the drive device 13 is shown in FIG. 2, and applies the gate drive signal to the gate of the IGBT 11. A voltage $V_{GE}$ of the gate drive signal is generally set as 15V in accordance with the output characteristics of the IGBT 11 (11a to 11f).

Also, the drive device 13, as well as including an output current detection circuit 15 which detects an output current to be supplied to the three-phase alternating current motor M from the IGBT 11, includes a voltage detection circuit 16 which detects a collector-emitter voltage Vce of the IGBT 11. The output current detection circuit 15 is configured in such a way as to detect the output current of the IGBT 11 from, for example, a current flowing through a current detection emitter included in the IGBT 11. Also, the voltage detection circuit 16 detects the collector-emitter voltage Vce of the IGBT 11 as an on-voltage of the IGBT 11.

A load condition determination circuit 17 provided in the drive device 13 includes an overcurrent detection section 17a and a voltage determination section 17b. The overcurrent detection section 17a, by comparing the output current with a predetermined current threshold value, determines whether or not the current to be supplied to the three-phase alternating current motor M is an overcurrent exceeding a rated current. Also, the voltage determination section 17b compares the on-voltage of IGBT 11 when an overcurrent is detected, that is, the collector-emitter voltage Vce with a first threshold voltage Vth1 and second threshold voltage Vth2.

Incidentally, the first threshold voltage Vth1 is set as being, for example, substantially twice the on-voltage of the IGBT 11 when the output current of the IGBT 11 is within the range of the rated current. Specifically, as the on-voltage of the IGBT 11 when in a normal operation in which to output the rated current is 2 to 3V, the first threshold voltage Vth1 is set to on the order of 5V. Also, the second threshold voltage Vth2 is set as being, for example, substantially ½ of a maximum rated voltage of the IGBT 11. Specifically, in the case of the IGBT 11 with a maximum rated voltage of 100V, the second threshold voltage Vth2 is set to on the order of 50V.

Further, when the collector-emitter voltage Vce detected by the voltage determination section 17b is lower than the first threshold voltage Vth1 when an overcurrent is detected in the overcurrent detection section 17a, the load condition determination circuit 17 determines this condition to be, for example, a condition in which the overcurrent is temporarily flowing to the three-phase alternating current motor M when the three-phase alternating current motor M starts. As opposed to this, when the collector-emitter voltage Vce detected by the voltage determination section 17b is higher than the second threshold voltage Vth2, the load condition determination circuit 17 determines this condition to be a condition in which the overcurrent is flowing to the three-phase alternating current motor M due to a short circuit being generated in the three-phase alternating current motor M.

That is, the load condition determination circuit 17, by focusing attention on the collector-emitter voltage Vce of the IGBT 11 when an overcurrent is detected, determines whether the overcurrent is a temporary one resulting from the operating condition of the load or results from a short circuit of the load. Further, the load condition determination circuit 17, based on a result of the determination, controls a gate voltage setting circuit 18, and changes and sets the gate voltage to be applied to the IGBT 11, as will be described hereafter.

Now, the gate voltage setting circuit 18, which operates by receiving the determination result of the load condition determination circuit 17, assumes the role of changing the voltage of the gate drive signal output by the gate drive circuit 14 when an overcurrent is detected, that is, the gate voltage to be applied to the IGBT 11. The gate voltage setting circuit 18 functions as heat generation amount suppression means which suppresses the heat generation amount of the IGBT 11 by changing and setting the voltage of the gate drive signal output by the gate drive circuit 14 to be higher than a first gate voltage when in the normal operation. Also, the gate voltage setting circuit 18 functions as an output current reduction means which reduces the output current by changing and setting the voltage of the gate drive signal to be lower than the first gate voltage when in the normal operation.

Figure 3:
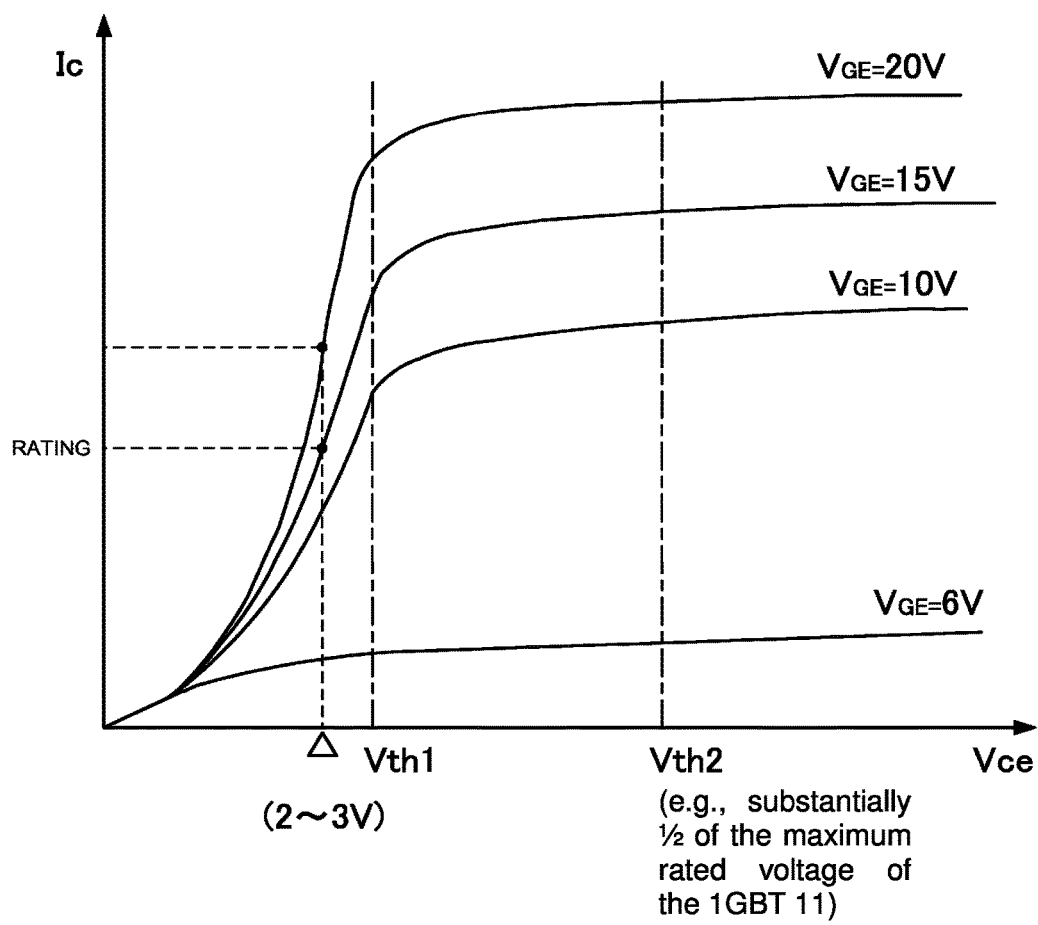
FIG. 3 is a diagram showing the output characteristics of the insulated gate semiconductor element.
Figure 4:
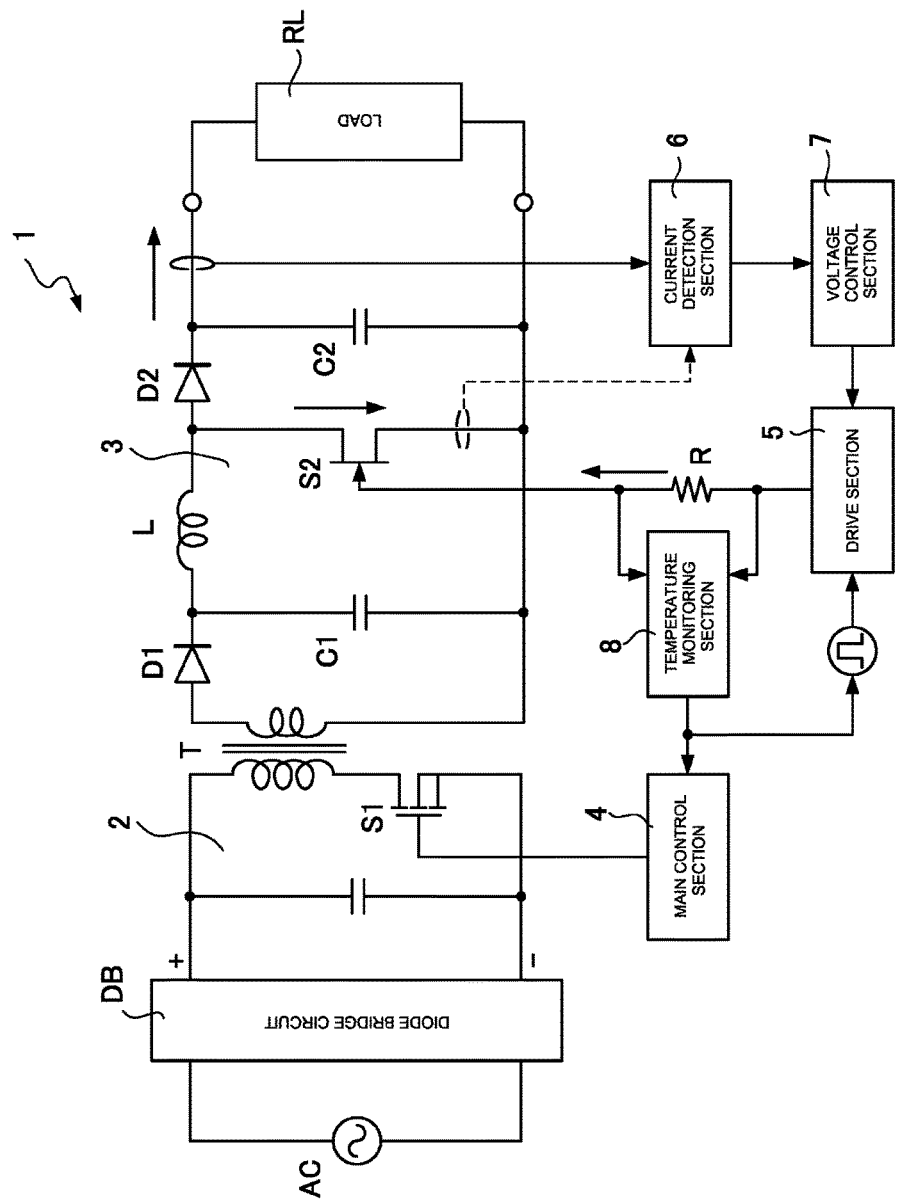
FIG. 4 is a diagram showing one example of a drive device of a known junction semiconductor element.

Specifically, the gate voltage setting circuit 18, when it is determined that the overcurrent is temporary, sets a voltage of 15V of a first gate drive signal, which is being output by the gate drive circuit 14 when in the normal operation, to a higher voltage of, for example, 20V. By so doing, a gate voltage $V_{GE}$ of 20V higher than when in the normal operation is applied to the gate of the IGBT 11, thus lowering the on-resistance of the IGBT 11. As a result, the output characteristics of the IGBT 11 are temporarily changed, as shown in FIG. 3, and it is thus possible to cause a current larger than when in the normal operation to flow temporarily without causing an excessive heat generation of the IGBT 11.

Also, when it is determined that the overcurrent results from the short circuit of the three-phase alternating current motor M, the gate voltage setting circuit 18 sets the voltage of 15V of the gate drive signal, which is being output by the gate drive circuit 14 when in the normal operation, to be lower, thus suppressing a current output via the IGBT 11. Preferably, by setting the gate voltage $V_{GE}$ to be applied to the gate of the IGBT 11 to, for example, 0V, the IGBT 11 is operated off, thereby interrupting the output current, thus protecting the IGBT 11 against the overcurrent.

This kind of voltage control of the gate drive signal is achieved by changing the drive voltage of an unshown transistor circuit configuring the output stage of the gate drive circuit 14.

Hence, according to the inverter device 10 including the drive device 13 configured in the heretofore described way, it is determined, by focusing attention on the on-voltage of the IGBT 11 when an overcurrent is generated, specifically, on the collector-emitter voltage Vce, whether or not the overcurrent is a temporary one responding to the condition of the three-phase alternating current motor M. Further, when the overcurrent is a temporary overcurrent, the on-resistance of the IGBT 11 is lowered by setting the voltage of the gate signal to be applied to the gate of the IGBT 11 to be temporarily high, thereby suppressing the heat generation of the IGBT 11 due to the overcurrent.

Consequently, there is no need to select an IGBT 11 having a high short-circuit capacity in anticipation of even the magnitude of a temporary overcurrent resulting from the condition of the three-phase alternating current motor M, and it is possible to construct the inverter device 10 using an IGBT 11 having a short-circuit capacity which satisfies a rated output. Therefore, it is possible to realize the inverter device 10 at a low cost by making full use of the characteristics of a small and inexpensive IGBT 11, and the practical advantage of the inverter device 10 is immense.

The disclosure is not limited to the described embodiment. Herein, a description has been given by exemplifying the case of configuring the inverter device 10 as the insulated gate semiconductor device, but the disclosure can also be applied equally to the case of configuring a chopper circuit using the IGBT 11. Also, the disclosure can also be applied equally to the case of using a power MOS-FET as an insulated gate semiconductor. In this case, a configuration only has to be such as to detect a drain-source voltage Vds of the power MOS-FET as the on-voltage thereof and determine a load condition of the three-phase alternating current motor M when an overcurrent is generated.

Furthermore, as an insulated gate semiconductor configuring the inverter device 10, not only a Si-based semiconductor, but a wide band gap semiconductor of, for example, SiC, GaN, or diamond may be applied, or only one portion of the insulated gate semiconductor may be replaced with a wide band gap semiconductor.

Also, it is sufficient to set the first threshold voltage Vth1 and second threshold voltage Vth2 in response to the specifications and operating characteristics of the insulated gate semiconductor device, the drive conditions of the insulated gate semiconductor element, or the like. Furthermore, it goes without saying that the disclosure can also be applied equally in an insulated gate semiconductor device which supplies power to a load other than the three-phase alternating current motor M. In other respects, the disclosure can be implemented by being variously modified without departing from the scope.

What is claimed is:

1. An insulated gate semiconductor device for driving a load, comprising:
   an insulated gate semiconductor element having a first terminal, a second terminal and a gate terminal, the insulated gate semiconductor element being configured to be turned on by a gate voltage applied at the gate terminal, to thereby output a current through the first terminal to the load;
   an output current detection circuit configured to detect the outputted current to output a current detection result;
   a voltage detection circuit configured to detect a voltage between the first and second terminals of the insulated gate semiconductor element to output a voltage detection result;
   a load condition determination circuit configured
      to receive the current detection result from the output current detection circuit and the voltage detection result from the voltage detection circuit,
      to compare the current detection result with a predetermined threshold current, to thereby determine whether the outputted current is an overcurrent,
      to compare the voltage detection result with a first predetermined threshold voltage and with a second predetermined threshold voltage higher than the first predetermined threshold voltage, and
      upon determining that the outputted current is an overcurrent, to determine that the overcurrent is
         a temporary overcurrent when the voltage detection result is lower than the first predetermined threshold voltage, and
         a short-circuit overcurrent when the voltage detection result is higher than the second predetermined threshold voltage; and
   a gate drive circuit configured
      to generate the gate voltage applied to the gate terminal of the insulated gate semiconductor element, and
      to increase the gate voltage in response to determination by the load condition determination circuit that the outputted current is the temporary overcurrent.

2. The insulated gate semiconductor device according to claim 1, wherein the insulated gate semiconductor element is an insulated-gate bipolar transistor (IGBT), and the first and second terminal are respectively an emitter terminal and a collector terminal of the IGBT.

3. The insulated gate semiconductor device according to claim 1, wherein
   the insulated gate semiconductor element is a power metal-oxide-semiconductor field-effect transistor (MOS-FET), and
   the first and second terminals are respectively a drain terminal and a source terminal of the power MOS-FET.

4. The insulated gate semiconductor device according to claim 1, wherein the first predetermined threshold voltage has value that is substantially twice of the detected voltage between the first and second terminals of the insulated gate semiconductor element when the outputted current is no higher than the predetermined threshold current.

5. The insulated gate semiconductor device according to claim 1, wherein the gate drive circuit is configured to decrease the gate voltage in response to determination that the outputted current is the short-circuit overcurrent.

6. The insulated gate semiconductor device according to claim 1, wherein the first gate voltage is substantially 15V.

7. The insulated gate semiconductor device according to claim 1, wherein the increase of the gate voltage lowers on-resistance of the insulated gate semiconductor element.

8. The insulated gate semiconductor device according to claim 5, wherein the second predetermined threshold voltage is set as substantially ½ of a maximum rated voltage of the insulated gate semiconductor element.

9. The insulated gate semiconductor device according to claim 5, wherein the decrease of the gate voltage reduces the outputted current.

10. A method for an insulated gate semiconductor device to drive a load, the insulated gate semiconductor device including an insulated gate semiconductor element having a first terminal, a second terminal and a gate terminal, the insulated gate semiconductor element being configured to be turned on by a gate voltage applied at the gate terminal thereof, to thereby output a current through the first terminal to the load, the method comprising:

detecting the outputted current of the insulated gate semiconductor element to the load to thereby obtain a current detection result;

detecting a voltage between the first and second terminals of the insulated gate semiconductor element to thereby obtain a voltage detection result;

comparing the current detection result with a predetermined threshold current, to thereby determine whether the outputted current is an overcurrent;

comparing the voltage detection result with a first predetermined threshold voltage, and with a second predetermined threshold voltage higher than the first predetermined threshold voltage;

upon determining that the outputted current is an overcurrent, determining that the overcurrent is a temporary overcurrent when the voltage detection result is lower than the first predetermined threshold voltage, and a short-circuit overcurrent when the voltage detection result is higher than the second predetermined threshold voltage; and in response to determination that the outputted current is the temporary overcurrent, increasing the gate voltage applied to the gate terminal of the insulated gate semiconductor element.

11. The method of claim 10, further comprising:

in response to determination that the outputted current is the short-circuit overcurrent, decreasing the gate voltage applied to the gate terminal of the insulated gate semiconductor element.

12. The method of claim 10, wherein the insulated gate semiconductor element is an insulated-gate bipolar transistor (IGBT), and the first and second terminals are respectively an emitter terminal and a collector terminal of the IGBT.

13. The method of claim 10, wherein the insulated gate semiconductor element is a power metal-oxide-semiconductor field-effect transistor (MOS-FET), and the first and second terminals are respectively a drain terminal and a source terminal of the power MOS-FET.

* * * * *